United States Patent [19]

Sasaki et al.

[11] Patent Number: 4,777,190

[45] Date of Patent: Oct. 11, 1988

[54] PHOTOPOLYMERIZABLE COMPOSITION BASED ON A VINYL COMPOUND, A SULFUR-CONTAINING COMPOUND AND AN α-DIKETONE

[75] Inventors: Isao Sasaki, Hiroshima; Nobuhiro Mukai, Ohtake, both of Japan

[73] Assignee: Mitsubishi Rayon Company Limited, Tokyo, Japan

[21] Appl. No.: 765,925

[22] Filed: Aug. 15, 1985

[30] Foreign Application Priority Data

May 13, 1985 [JP] Japan ................................ 60-99545
May 14, 1985 [JP] Japan ............................... 60-100478

[51] Int. Cl.$^4$ ........................... C08F 2/50; C08F 4/40; C08F 18/16; C08F 20/20
[52] U.S. Cl. ...................................... 522/17; 522/27; 522/54; 522/81; 522/83; 522/181; 522/183
[58] Field of Search ..................... 522/27 (U.S. only), 522/17 (U.S. only), 37

[56] References Cited

U.S. PATENT DOCUMENTS

| | | | |
|---|---|---|---|
| 2,367,660 | 1/1945 | Agre | 522/37 |
| 2,989,455 | 6/1961 | Neugebauer | 522/27 |
| 3,814,702 | 6/1974 | Bourdon | 522/17 |
| 4,053,316 | 10/1977 | Lu | 522/27 |
| 4,168,981 | 9/1979 | Donald | 522/27 |
| 4,207,156 | 6/1980 | Collins | 522/27 |
| 4,304,841 | 12/1981 | Horn et al. | 522/95 |
| 4,357,221 | 11/1982 | Lehner | 522/90 |
| 4,415,652 | 11/1983 | Proskow | 522/17 |
| 4,459,193 | 7/1984 | Ratcliffe | 526/208 |

FOREIGN PATENT DOCUMENTS

| | | | |
|---|---|---|---|
| 24987 | 2/1979 | Japan | 522/17 |
| 142258 | 8/1984 | Japan | 522/17 |

OTHER PUBLICATIONS

"Photocurable Polyester—" Yamaura; Chemical Abstracts, vol. 91, No. 4, Abst. No. 22078n, 1979.
"Photocurable Coating—" Sony; Chemical Abstracts, vol. 101, No. 26, Abstract No. 232076m, 1984.

*Primary Examiner*—John C. Bleutge
*Assistant Examiner*—Arthur H. Koeckert
*Attorney, Agent, or Firm*—Oblon, Fisher, Spivak, McClelland & Maier

[57] ABSTRACT

A photopolymerizable composition comprising a vinylic compound, a sulfur-containing compound and an α-diketone is disclosed. The sulfur-containing compound may be a mercaptobenzoic acid or a polysulfide.

18 Claims, No Drawings

PHOTOPOLYMERIZABLE COMPOSITION BASED ON A VINYL COMPOUND, A SULFUR-CONTAINING COMPOUND AND AN α-DIKETONE

BACKGROUND OF THE INVENTION

1. Field of the Invention

This invention relates to photopolymerizable compositions comprising a vinylic compound, a sulfur-containing compound and an α-diketone.

2. Discussion of the Background

Photopolymerization is used in various fields. For example, print materials, photosensitive agents used in reproduction, printed wirings, integrated circuits, and image formation for precision fabrication, such as shadow masks, as well as paints, printing inks and adhesives, all rely on photopolymerization.

Photopolymerization is also used in dentistry, for example, photopolymerizable materials are used in association with tooth fillers (composite resins or the likes), tooth sealing materials and dental adhesives, as well as in the production of tooth decay preventive fillers, tooth crowns and dentures.

A case in point with regards to the photopolymerizable compositions described above, is a photopolymerizable composition curable with visible light or UV-rays described in Japanese Patent Publication No. 10986/1979. This photopolymerizable composition comprises a photosensitive catalyst containing a photosensitive agent/reducing agent as the photo-initiator. This photo-initiator is made up of components (a) and (b). Component (a) has at least one photosensitive agent represented by the following formula:

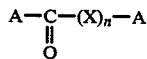

where;

X represents $>C=O$, $>CR_5R_6$ or $>CR_7OR_8$; and $R_5$–$R_8$ may be either identical or different and each represents a hydrogen or a hydrocarbon group; n is 0 or 1; and the groups A which may be either identical to each other or different from each other represent an unsubstituted hydrocarbon group or a substituted hydrocarbon group. Both of the groups A may be coupled directly, joined by way of a bivalent hydrocarbon group, or alternatively, both of the groups A may form together a condensed aromatic ring. The group A may represent an unsubstituted aromatic group or a substituted aromatic group if n is 1 and X is $>CR_5R_6$ and if n=0. Component (b) has at least one reducing agent represented by the formula:

NRRR where
each R may be identical or different with respect to each other; and each R represents a hydrogen, an unsubstituted hydrocarbon group, a substituted hydrocarbon group or a group in which two R form a ring together with N. Three R do not simultaneously represent substituted hydrocarbon groups and N is not coupled directly to the aromatic group. The photopolymerizable composition also contains an unsaturated polymerizable ethylenic material. Particularly preferred examples of this unsaturated polymerizable ethylenic material, for the photosensitive agent are: biacetyl, benzil, benzophenone, camphorquinone and the like. For the reducing agent preferred examples are: trimethylamine, tripropylamine, dimethylamine, propylamine, N,N'-dimethylaniline, N-methyldiphenylamine, ethylenediamine, hexamethylenediamine, dimethylaminoethyl methacrylate, piperidine and the like.

Although the materials using these photoinitiators can be rapidly cured via photoirradiation, they suffer several drawbacks. The curing products are significantly colored (mostly yellowed), they show significant aging (i.e. change in color tone) upon exposure to sunlight or water, and products with low strength are produced.

Accordingly there is a particular need for a novel photopolymerization composition which may have wide application and which does not suffer from the drawbacks outlined above.

SUMMARY OF THE INVENTION

Accordingly it is an object of this invention to provide a novel photopolymerizable composition which provides excellent products, free from undesirable coloration.

It is another object of this invention to provide a novel photopolymerizable composition which is not subject to aging (i.e. change in color tone) upon exposure to sunlight or water.

It is another object of this invention to provide a novel photopolymerizable composition which provides products having excellent mechanical properties.

It has now been surprisingly discovered that a photopolymerizable composition comprising a vinylic compound, a sulfur-containing compound and an α-diketone meets all of the objects of this invention outlined above. The sulfur-containing compound may be a mercaptocarboxylic acid or a polysulfide.

Accordingly this invention relates to a novel photopolymerizable composition comprising a vinylic compound, a mercaptocarboxylic acid and an α-ketone. This invention also provides a novel photopolymerizable composition comprising a vinylic compound, a polysulfide and an α-diketone. In this photopolymerizable composition the sulfur-containing compound (i.e. the mercaptocarboxylic acid or the polysulfide) and the α-diketone are photopolymerization initiators.

DETAILED DESCRIPTION OF THE PREFERRED EMBODIMENTS

This invention thus relates to a novel photopolymerizable composition which comprises a vinylic compound, a sulfur-containing compound and an α-diketone.

In a preferred embodiment of this invention, the photopolymerizable comprises a vinylic compound, a mercaptocarboxylic acid and an α-diketone, or the photopolymerizable composition comprises a vinylic compound, a polysulfide and an α-diketone.

In another preferred embodiment of this invention, the photopolymerizable composition may additionally contain a filler well known in this art.

In another preferred embodiment of this invention, the photopolymerizable composition contains a mercaptocarboxylic acid compound represented by one of the formulae below:

methacrylate. Other examples of the polyfunctional vinylic compound are represented by the formula:

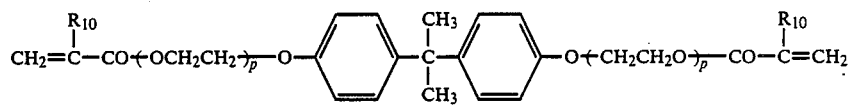

where;

$R_{10}$ is a hydrogen atom or a methyl group; and p is an integer of from 1 to 20. Examples of these polyfunctional vinylic compounds are: bisphenol A diglycidyl acrylate or methacrylate, urethane di-acrylate or methacrylate, trimethylolpropane triacrylate or methacrylate, pentaerythritol tetraacrylate or methacrylate, bisphenol A di-acrylate and methacrylate. These acrylates and methacrylates may be used alone or as a combination of two or more.

The mercaptocarboxylic acid used as the photopolymerization initiator in this invention is a compound, preferably, represented by the following formulae:

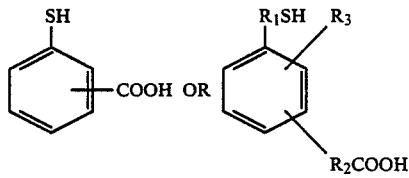

where:

$R_1$ and $R_2$ each are a $C_{1-5}$ alkylene group; or a phenylene group;

$R_3$ is a nitro group, an oxy group, an amino group or a halogen atom. Specific examples can include, for example, o-, m- and p-mercaptobenzoic acid, o-, m- and p-mercaptophenyl acetic acid, o-, m- and p-mercaptophenyl propionic acid, o-, m- and p-mercaptophenyl butyric acid, mercaptobiphenyl carboxylic acid, o-, m- and p-mercaptomethyl benzoic acid, o-nitro-p-mercaptobenzoic acid, o-hydroxy-p-mercaptobenzoic and, o-amino-p-mercaptobenzoic acid and o-chloro-p-mercaptobenzoic acid. Particularly preferred mercaptocarboxylic acid can include, for example, o-mercaptobenzoic acid (thiosalicylic acid), m-mercaptobenzoic acid and p-mercaptobenzoic acid.

While all sorts of α-diketones may be used with no particular restriction, preferred α-diketones are camphorquinone, benzil, acetylbenzoyl, acenaphthenequinone, α-naphthil, dichlorobenzil, biacetyl, and β-naphthil. Among all, camphorquinone is most preferred.

The polysulfide used as the photopolymerization initiator in this invention is a compound, preferably, represented by the following formula:

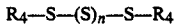

where;

n is an integer from 0 to 10;

$R_4$ is a saturated or unsaturated $C_{1-10}$ alkyl group, a phenyl or a benzyl group, each of which may be unsubstituted or substituted with a carboxylic group at any position. Specific examples can include, for example, dimethyl disulfide, diethyl disulfide, dipropyl disulfide, dibutyl disulfide, diphenyl disulfide, dibenzyl sulfide, trimethylene disulfide, dimethyl trisulfide, diethyl trisulfide, dipropyl trisulfide, dibutyl trisulfide, diphenyl trisulfide, dibenzyl trisulfide, p-(phenyl disulfanil) ben-

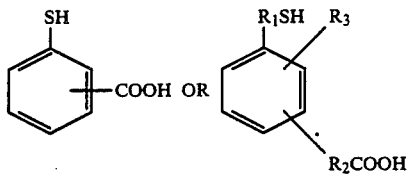

wherein $R_1$ and $R_2$ independently may be a $C_{1-5}$ alkylene group or a phenylene group; and $R_3$ may be a nitro group, a hydroxyl group, an amino group or a halogen atom.

In another preferred embodiment of this invention, the α-diketone may be camphorquinone.

In another preferred embodiment of this invention, the mercaptocarboxylic acid may be orthomercaptobenzoic acid (i.e. thiosalicylic acid), metamercaptobenzoic acid or para-mercaptobenzoic acid.

In another preferred embodiment of this invention, the polysulfide may be a compound represented by the following formula:

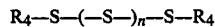

wherein n is an integer of from 0 to 10;

$R_4$ is either a saturated or an unsaturated $C_{1-20}$ alkyl group, a phenyl or a benzyl group1, each of which may be either unsubstituted or substituted with a carboxylic group at any position.

The vinylic monomer constituting the composition of this invention may either be a mono-functional vinylic compound or a poly-functional vinylic compound. Examples of mono-functional vinylic compound can include styrene, acrylonitrile, vinyl acetate, methyl acrylate and methacrylate, ethyl acrylate and methacrylate, butyl acrylate, butyl methacrylate, hydroxyethyl acrylate, hydroxyethyl methacrylate, methoxyethyl acrylate, methoxyethyl methacrylate, glycidyl acrylate, glycidyl methacrylate, methacryloxyethyl trimellitic acid or an acid anhydride thereof. Examples of the polyfunctional vinyl compounds can include, for example, those represented by the formula:

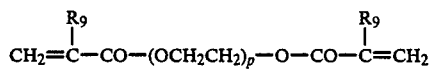

where;

$R_9$ is a hydrogen atom or a methyl group and p is an integer of from 1 to 20. The polyfunctional vinylic compound, may be, for example, ethylene glycol di-acrylate or methacrylate, diethylene glycol di-acrylate or methacrylate, triethylene glycol di-acrylate or methacrylate, polyethylene glycol di-acrylate or methacrylate, 1,4-butanediol di-acrylate or methacrylate, 1,3-butanediol di-acrylate or methacrylate, 1,6-hexanediol di-acrylate or methacrylate and glycerine di-acrylate or zoic acid and 3,3'-trithiodipropionic acid. Particularly preferred polysulfide can include, for example, diphenyl disulfide, dibenzyl disulfide, di-t-butyl disulfide, trimethylene disulfide, p-(phenyl disulfanil) benzoic acid, diphenyl trisulfide and dibenzyl trisulfide.

The photopolymerization initiator is added in an amount from $10^{-5}$ % by weight to 30 % by weight, preferably, from $10^{-3}$ % by weight to 15 % by weight and, most preferably, from $10^{-1}$ to 5 % by weight based on the vinylic monomer. Further, the blending amount of the α-diketone lies within a range form $10^{-5}$ % by weight to $10^2$ % by weight, preferably, from $10^{-3}$ % by weight to 50 % by weight and, most preferably, from $10^{-1}$ % by weight to 20 % by weight based on the mercaptocarboxylic acid. These blending amounts are preferred for obtaining a composition free from coloraton and aging color change in the photopolymerization curing products, and for products with high mechanical strength.

In the composition according to this invention, a filler may further be added as required to the ingredients as described above. Preferred filler ingredient can include oxides, hydroxides, chlorides, sulfates, sulfites, carbonates, phosphates, silicates of metals belonging to the groups I, II, III, IV and V of the Periodic Table and transition metals, as well as mixture and composite salts thereof. Silicon dioxide, quartz powder, aluminum oxide, barium sulfate, titanium oxide, talc, glass powder, glass beads, glass fibers, glass fillers containing barium salt and lead salt, silica gel, colloidal silica, carbon fibers, zirconium oxide, tin oxide and other ceramic powder are particularly preferred. As the filler, any nontreated fillers, fillers surface-treated with silane coupling agents or the likes and those organic composite fillers composited with a polymer and pulverized may also be used.

While the blending amount of the filler may properly be varied depending on the purpose of use of the photopolymerization curing products, it is blended within a range from 1 to $10^3$ % by weight, preferably, from 10 to $9.5 \times 10^2$ % by weight and, particularly preferably, from 20 to $9.0 \times 10^2$ % by weight based on the vinylic monomer as described above. The composition may be served as a paste-like, for example, when it is used in dental filler application.

Furthermore, the composition according to this invention may also be blended as required with colorants, polymerization inhibitors (for example hydroquinone, methoxybenzophenone, methylphenol, hydroquinonemonomethyl ether), oxidation stabilizers, UV absorbers (for example, benzophenone), pigments (for example, iron oxide, and titanium oxide), dyes and the like.

In the photopolymerizable composition according to this invention, since a photopolymerization initiator capable of curing by visible light radiation is used, it does not suffer the problems of prior UV-ray photopolymerization, compositions. Human toxicity, poor curing performance (depth) and expensive installation cost are all absent. Further, the curing products obtained by photocuring have an excellent color stability, a very pleasant appearance and high mechanical properties, none of which could be obtained by the prior process.

Other features of this invention will become apparent in the following descriptions of exemplary embodiments which are given for illustration of the invention and are not intended to be limiting thereof.

EXAMPLES 1-3, COMPARATIVE EXAMPLES 1-2

A monomer mixture comprising:
2,2-bis(4-(3-methacryloxy-2-hydroxypropoxy)phenyl)-propane (hereinafter simply referred to as Bis-GMA) ... 4 g
Triethyleneglycol dimethacrylate (hereinafter simply referred to as 3G) ... 6 g
Photopolymerization initiator (Compounds and the addition amount listed in Table 1)
was poured into a teflon tube (4 mm inner diameter, 20 mm height), sealed at the bottom until the upper surface of the solution was level with the upper surface of the teflon tube. The teflon tube was disposed such that the liquid level was situated at a 1 mm distance from the light irradiation surface of a visible light irradiator (manufactured by 3M Corporation, Trade name: OPTILUX) and visible rays were irradiated for 30 seconds. The poured monomer mixture was recovered from the teflon tube, removed with a nonpolymerized portion, and the "thickness" was measured for the thus obtained polymerization curing product.

Table 1 shows the kind and the amount of the photo-initiator, as well as the result for measurement of the foregoing "thickness".

TABLE 1

| | Photoinitiator | Addition amount (%) (based on monomer) | Thickness measured (mm) |
|---|---|---|---|
| Example 1 | thiosalicylic acid + camphorquinone | 3.0 0.05 | more than 20 |
| Example 2 | m-mercaptobenzoic acid + camphorquinone | 3.0 0.05 | more than 20 |
| Example 3 | p-mercaptobenzoic acid + camphorquinone | 3.0 0.05 | more than 20 |
| Comparative Example 1 | camphorquinone | 0.05 | 4.0 |
| Comparative Example 2 | N,N'—dimethylaniline + camphorquinone | 3.0 0.05 | 13.8 |

As apparent from Table 1, the compositions according to this invention have an excellent photocuring performance as compared with the known compositions of the comparative examples. Furthermore, the photocuring polymerizates according to this invention suffered no substantial coloration, and were remarkably finer as compared with that of the comparative examples.

EXAMPLES 4-6, COMPARATIVE EXAMPLES 3-4

A monomer filler mixture (paste) comprising:
Bis-GMA ... 0.8 g
3G ... 1.2 g
Silane modified quartz powder ... 8 g
Photopolymerization initiator (Compounds and the addition amount listed in Table 2)
was packed into a teflon tube (4 mm inner diameter, 20 mm height) sealed at the bottom until the upper surface of the paste was level with the upper surface of the teflon tube. The teflon tube was disposed such that the paste surface was situated at a 1 mm distance from the light irradiation surface of a visible light irradiator manufactured by 3M Corporation, Trade name: OPTILUX)

and visible rays were irradiated for 30 seconds. The packed paste was recovered from the teflon tube, removed with a not-polymerized portion and the "thickness" was measured for the thus obtained polymerization curing product.

Table 2 shows the kind and the amount of the photoinitiator, as well as the result for measurement of the foregoing "thickness".

TABLE 2

|  | Photoinitiator | Addition amount (%) (based on monomer) | Thickness measured (mm) |
|---|---|---|---|
| Example 4 | Thiosalicylic acid + camphorquinone | 3.0 0.05 | 12.0 |
| Example 5 | m-mercaptobenzoic acid + camphorquinone | 3.0 0.05 | 11.5 |
| Example 6 | p-mercaptobenzoic acid + camphorquinone | 3.0 0.05 | 12.0 |
| Comparative Example 3 | camphorquinone | 0.05 | 1.2 |
| Comparative Example 4 | N,N'—dimethylaniline + camphorquinone | 3.0 0.05 | 5.6 |

As apparent from Table 2, the compositions according to this invention have an excellent photocuring performance also in the case where the filler is added as compared with the known compositions of the comparative examples. Furthermore, the photocuring polymerizate according to this invention suffered no substantial coloration, and were remarkably finer as compared with that of the comparative examples.

COMPARATIVE EXAMPLE 5

After pouring each of the compositions corresponding to examples 1 and 4 respectively into the abovementioned teflon tube, the upper surface of teflon tube was covered with an aluminum foil so that visible rays could not reach the poured mixture. Then, the tube was disposed such that the upper surface of the poured mixture was at a 1 mm distance from the light irradiation surface and visible rays were irradiated for 3 minutes by no polymerization took place.

COMPARATIVE EXAMPLE 6

After pouring each of the compositions corresponding to Examples 1 and 4 respectively into the abovementioned teflon tube, the upper surface of teflon tube was covered with an aluminum foil so that visible rays could not reach the poured mixture. Then, the tube was heated for 3 minutes at 60° C. but no polymerization took place.

EXAMPLES 7-9, COMPARATIVE EXAMPLE 7-9

A monomer filler mixture (paste) comprising:
Bis-GMA . . . 0.8 g
3G . . . 1.2 g
Silane modified quartz powder . . . 7.4 g
Silicon dioxide fine powder . . . 0.6 g
Photopolymerization initiator (Compound and the addition amount listed in Table 3)
was irradiated with visible rays for 60 seconds under the same procedures as those in Example 4. Then, the thus obtained photopolymerization curing products were cut into cylindrical specimens each of 4×6 mm, for which measurement was made to the compression strength, color change after exposure test to sunlight for one week and color change after one week immersion test in water at 60° C.

Table 3 shows the kind and the amount of the photoinitiator, as well as the results of the above-mentioned measurement.

TABLE 3

|  | Photoinitiator | Addition amount (%) (based on monomer) | Compression strength (kg/cm$^2$) | Color change after one week exposure to sunlight | Color change after one week immersion in water at 60° C. |
|---|---|---|---|---|---|
| Example 7 | thiosalicylic acid + camphorquinone | 3.0 0.05 | 2950 | none | none |
| Example 8 | m-mercaptobenzoic acid + camphorquinone | 3.0 0.05 | 2750 | " | " |
| Example 9 | p-mercaptobenzoic acid + camphorquinone | 3.0 0.05 | 2800 | " | " |
| Comparative Example 7 | camphorquinone | 3.0 | 1460 | extremely great | extremely great |
| Comparative Example 8 | N,N'—dimethylaniline + camphorquinone | 3.0 0.05 | 1780 | " | " |
| Comparative Example 9 | 5-butylbarbituric acid + camphorquinone | 3.0 0.05 | 1800 | great | great |

As apparent from Table 3, the compositions according to this invention have excellent mechanical strength and extremely high color stability as compared with the known compositions of the comparative examples.

EXAMPLES 10-16, COMPARATIVE EXAMPLES 10-11

A monomer mixture comprising:
2,2-bis(4-(3-methacryloxy-2-hydroxypropoxy)phenyl)-propane (hereinafter simply referred to as Bis-GMA) . . . 4 g
Triethyleneglycol dimethacrylate (hereinafter simply referred to as 3G) . . . 6 g
Photopolymerization initiator (Compounds and the addition amount listed in Table 4)
was poured into a teflon tube (4 mm inner diameter, 20 mm height) sealed at the bottom until the upper surface of the solution was level with the upper surface of the teflon tube. The teflon tube was disposed such that the liquid level was situated at a 1 mm distance from the light irradiation surface of a visible light irradiator (manufactured by 3M Corporation, Trade name: OPTILUX) and visible rays were irradiated for 30 seconds. The poured monomer mixture was recovered from the teflon tube, removed with not-polymerized portion and the "thickness" was measured for the thus obtained polymerization curing product.

Table 4 shows the kind and the amount of the photo initiator, as well as the result for measurement of the foregoing "thickness".

TABLE 4

| | Photoinitiator | Addition amount (%) (based on monomer) | Thickness measured (mm) |
|---|---|---|---|
| Example 10 | diphenyl disulfide + camphorquinone | 3.0 0.05 | more than 20 |
| Example 11 | dibenzyl disulfide + camphorquinone | 3.0 0.05 | more than 20 |
| Example 12 | di-t-butyl disulfide + camphorquinone | 3.0 0.05 | more than 20 |
| Example 13 | trimethylene disulfide + camphorquinone | 3.0 0.05 | more than 20 |
| Example 14 | p-(phenyldisulfanil) benzoic acid + camphorquinone | 3.0 0.05 | more than 20 |
| Example 15 | diphenyl trisulfide + camphorquinone | 3.0 0.05 | more than 20 |
| Example 16 | dibenzyl trisulfide + camphorquinone | 3.0 0.05 | more than 20 |
| Comparative Example 10 | camphorquinone | 0.05 | 4.0 |
| Comparative Example 11 | N,N'—dimethylaniline + camphorquinone | 3.0 0.05 | 13.8 |

As apparent from Table 4, the compositions according to this invention have an excellent photocuring performance as compared with the known compositions of the comparative examples. Furthermore, the photocuring polymerizates according to this invention did not suffer substantial coloration, and were remarkably finer as compared with the comparative examples.

EXAMPLES 17–23, COMPARATIVE EXAMPLES 12–13

A monomer filler mixture (paste) comprising:
Bis-GMA . . . 0.8 g
3G . . . 1.2 g
Silane modified quartz powder . . . 8 g
Photopolymerization initiator (Compounds and the addition amount listed in Table 5)
was packed into a teflon tube (4 mm inner diameter, 20 mm height) sealed at the bottom until the upper surface of the paste was level with the upper surface of the teflon tube. The teflon tube was disposed such that the paste surface was situated at a 1 mm distance from the light irradiation surface of a visible light irradiator (manufactured by 3M Corporation, Trade name: OPTILUX) and visible rays were irradiated for 30 seconds. The packed paste was recovered from the teflon tube, removed with a non-polymerized portion and the "thickness" was measured for the thus obtained polymerization curing product.

Table 5 shows the kind and the amount of the photoinitiator, as well as the result for measurement of the foregoing "thickness".

TABLE 5

| | Photoinitiator | Addition amount (%) (based on monomer) | Thickness measured (mm) |
|---|---|---|---|
| Example 17 | diphenyl disulfide + camphorquinone | 3.0 0.05 | 13.0 |
| Example 18 | dibenzyl disulfide + camphorquinone | 3.0 0.05 | 11.1 |
| Example 19 | di-t-butyl disulfide + camphorquinone | 3.0 0.05 | 12.5 |
| Example 20 | trimethylene disulfide + camphorquinone | 3.0 0.05 | 10.6 |
| Example 21 | p-(phenyl disulfanil) benzoic acid + camphorquinone | 3.0 0.05 | 12.0 |
| Example 22 | diphenyl trisulfide + camphorquinone | 3.0 0.05 | 10.9 |
| Example 23 | dibenzyl trisulfide + camphorquinone | 3.0 0.05 | 12.8 |
| Comparative Example 12 | camphorquinone | 0.05 | 1.2 |
| Comparative Example 13 | N,N'—dimethylaniline + camphorquinone | 3.0 0.05 | 5.6 |

As apparent from Table 5, the compositions according to this invention have an excellent photocuring performance also in the case where the filler is added as compared with the known compositions of the comparative examples. Furthermore, the photocuring polymerizate according to this invention suffered no substantial coloration, and were remarkably finer as compared with the comparative examples.

COMPARATIVE EXAMPLE 14

After pouring each of the compositions corresponding to Examples 10 and 17 respectively into the above-mentioned teflon tube, the upper surface of teflon tube was covered with an aluminum foil so that visible rays could not reach the poured mixture. The tube was disposed such that the upper surface of the poured mixture was at a 1 mm distance from the light irradiation surface and visible rays were irradiated for 3 minutes but no polymerization took place.

COMPARATIVE EXAMPLE 15

After pouring each of the compositions corresponding to Examples 10 and 17 respectively into the above-mentioned teflon tube, the upper surface of teflon tube was covered with an aluminum foil so that visible rays could not reach the poured mixture. Then, the tube was heated for 3 minutes at 60° C. but no polymerization took place.

EXAMPLES 24–30, COMPARATIVE EXAMPLES 16–18

A monomer filler mixture (paste) comprising:
Bis-GMA . . . 0.8 g
3G . . . 1.2 g
Silane modified quartz powder . . . 7.4 g
Silicon dioxide fine powder . . . 0.6 g
Photopolymerization initiator (Compounds and the addition amount listed in Table 6)
was irradiated with visible rays for 60 seconds under the same procedures as those in Example 17. The thus obtained photopolymerization curing producs were cut into cylindrical specimens of 4×6 mm, for which measurement was made to the compression strength, color change after one week exposure test to sunlight and color change after one week immersion test in water at 60° C.

Table 6 shows the kind and the amount of the photoinitiator, as well as the results of the above-mentioned measurement.

TABLE 6

| | Photoinitiator | Addition amount (%) (based on monomer) | Compression strength (kg/cm$^2$) | Color change after one week exposure to sunlight | Color change after one week immersion in water at 60° C. |
|---|---|---|---|---|---|
| Example 24 | diphenyl disulfide + camphorquinone | 3.0 0.05 | 2980 | none | none |
| Example 25 | dibenzyl disulfide + camphorquinone | 3.0 0.05 | 2770 | " | " |
| Example 26 | di-t-butyl disulfide + camphorquinone | 3.0 0.05 | 2800 | " | " |
| Example 27 | trimethylene disulfide + camphorquinone | 3.0 0.05 | 2660 | none | none |
| Example 28 | p-(phenyl disulfanil) benzoic acid + camphorquinone | 3.0 0.05 | 2790 | " | " |
| Example 29 | diphenyl trisulfide + camphorquinone | 3.0 0.05 | 2620 | none | none |
| Example 30 | dibenzyl trisulfide + camphorquinone | 3.0 0.05 | 2600 | " | " |
| Comparative Example 16 | camphorquinone | 3.0 | 1460 | extremely great | extremely great |
| Comparative Example 17 | N,N'—dimethylaniline + camphorquinone | 3.0 0.05 | 1780 | " | " |
| Comparative Example 18 | 5-butylbarbituric acid + camphorquinone | 3.0 0.05 | 1800 | great | great |

As apparent from Table 6, the compositions according to this invention have excellent mechanical strength and extremely high color stability as compared with the known compositions of the comparative examples.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A photopolymerizable composition comprising:
   a vinylic monomer;
   a mixture of photoinitiators consisting of
   (a) a mercaptocarboxylic acid represented by the following formula:

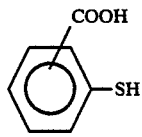

and
   (b) an α-diketone.

2. The photopolymerizable composition of claim 1, wherein the said photopolymerizable composition comprises a filler.

3. The photopolymerizable composition of claim 1, wherein the said mercaptocarboxylic acid is orthomercaptobenzoic acid, meta-mercaptobenzoic acid or para-mercaptobenzoic acid.

4. The photopolymerizable composition of claim 1, wherein the said vinylic monomer is at least one selected from a monoethylenically vinylic monomer and a polyethylenically vinylic monomer.

5. The photopolymerizable composition of claim 4, wherein the said monoethylenically vinylic monomer comprises styrene, acrylonitrile, vinyl acetate, methyl acrylate, methyl methacrylate, ethyl acrylate, ethyl methacrylate, butyl acrylate, butyl methacrylate, hydroxyethyl acrylate, hydroxyethyl methacrylate, methoxyethyl acrylate, methoxyethyl methacrylate, glycidyl acrylate or glycidyl methacrylate.

6. The photopolymerizable composition of claim 4, wherein the said polyethylenically vinylic monomer comprises a compound represented by the following formula:

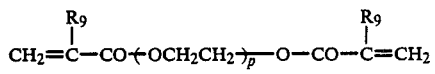

where R$_9$ is a hydrogen atom or a methyl group and p is an integer of from 1 to 20.

7. The photpolymerizable composition of claim 6, wherein the said polyethylenically vinylic monomer comprises ethylene glycol diacrylate, ethylene glycol dimethacrylate, diethylene glycol diacrylate, diethylene glycol dimethacrylate, triethylene glycol diacrylate, triethylene glycol dimethacrylate, polyethylene glycol diacrylate, or polyethylene glycol dimethacrylate.

8. The photpolymerizable composition of claim 4, wherein the said polyethylenically vinylic monomer comprises 1,4-butanediol diacrylate, 1,4-butanediol dimethacrylate, 1,3-butanediol diacrylate, 1,3-butanediol dimethacrylate, 1,6-hexanediol diacrylate, 1,6-hexanediol dimethyacrylate, glycerine diacrylate or glycerine dimethacrylate.

9. The photpolymerizable composition of claim 4, wherein the said polyethylenically vinylic monomer is a compound represented by the following formula:

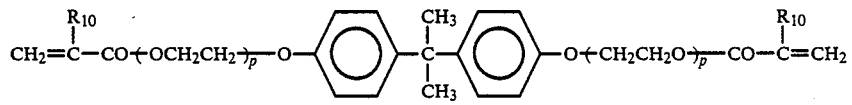

wherein $R_{10}$ is a hydrogen atom or a methyl group and p is an integer of from 1 to 20.

10. The photpolymerizable composition of claim 4, wherein the said polyethylenically vinylic monomer comprises bisphenol A diglycidyl acrylate or bisphenol A diglycidyl methacrylate.

11. The photpolymerizable composition of claim 4, wherein the said polyethylenically vinylic monomer comprises trimethylolpropane triacrylate, trimethylolpropane trimethacrylate, pentaerythritol tetraacrylate or pentaerythritol tetramethacrylate.

12. The photopolymerizable composition of claim 1, wherein the said mixture of photoinitiators are added in an amount of from $10^{-5}$ % by weight to 30 % by weight based on the vinylic monomer.

13. The photopolymerizable composition of claim 1, wherein the said mixture of photoinitiators are added in an amount of from $10^{-3}$ % by weight to 15% by weight based on the vinylic monomer.

14. The photpolymerizable composition of claim 1, wherein the said mixture of photoinitiators are added in an amount of from $10^{-1}$ % by weight to 5 % by weight based on the vinylic monomer.

15. The photpolymerizable composition of claim 2, wherein the said filler comprises an oxide, a hydroxide, a chloride, a sulfate, a sulfite, a carbonate, a phosphate, or a silicate of a metal of groups I, II, III, IV and V of the Periodic Table and transition metals.

16. The photpolymerizable composition of claim 2, wherein the said filler comprises silicon dioxide, quartz powder, aluminum oxide, barium sulfate, titanium oxide, talc, glass powder, glass beads, glass fibers, glass fillers containing barium salt and lead salt, silica gel, colloidal silica, carbon fibers, zirconium oxide or tin oxide.

17. The photopolymerizable composition of claim 1, wherein the said α-diketone comprises camphorquinone, acetylbenzoyl, acenaphthenequinone, α-naphthil, dichlorobenzil, biacetyl or β-naphthil.

18. The photopolymerizable composition of claim 17, wherein the said α-diketone comprises camphorquinone.

* * * * *